United States Patent
Kawata et al.

(10) Patent No.: US 7,372,881 B2
(45) Date of Patent: May 13, 2008

(54) SEMICONDUCTOR LASER WAVELENGTH CONTROL DEVICE

(75) Inventors: Izumi Kawata, Sagamihara (JP); Zhigang Peng, Ebina (JP); Akio Mukai, Machida (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 303 days.

(21) Appl. No.: 10/960,021

(22) Filed: Oct. 8, 2004

(65) Prior Publication Data

US 2005/0105570 A1    May 19, 2005

(30) Foreign Application Priority Data

Oct. 9, 2003  (JP)  ............................. 2003-350923
Oct. 23, 2003  (JP)  ............................. 2003-362840

(51) Int. Cl.
*H01S 3/00* (2006.01)
*H01S 3/13* (2006.01)

(52) U.S. Cl. ................ 372/38.01; 372/29.015
(58) Field of Classification Search ............. 372/20, 372/32, 29.015, 38.01
See application file for complete search history.

(56) References Cited

FOREIGN PATENT DOCUMENTS

| JP | 2001-7438 | 1/2001 |
|---|---|---|
| JP | 2002-270954 | 9/2002 |

OTHER PUBLICATIONS

Nobuhide Suda et al., PID Control, Sep. 2002, pp. 16-38.

*Primary Examiner*—Minsun Harvey
*Assistant Examiner*—Marcia A. Golub
(74) *Attorney, Agent, or Firm*—Finnegan, Henderson, Farabow, Garrett & Dunner, L.L.P.

(57) ABSTRACT

A semiconductor laser wavelength control device capable of controlling the optical wavelength constant even if the optical output intensity of the semiconductor laser varies and permitting a reduction in overall size is to be provided.

It is provided with control means which controls the optical wavelength of a laser diode 1 to a prescribed wavelength by driving a temperature control unit to control the temperature of the laser diode 1. The control means has a low pass characteristic, with a first photo electric conversion signal resulting from the conversion of light having passed an optical filter 7 into an electric signal and a target for the laser diode 1 to emit light of a prescribed wavelength being entered as inputs, supplies a control signal for driving the temperature of the temperature control unit, and is set that a greater one out of a plurality of poles has a higher frequency than the cut-off frequency $f_c$ and the zero point has a lower frequency than the cut-off frequency $f_c$ of the object of control.

24 Claims, 10 Drawing Sheets

SEMICONDUCTOR LASER WAVELENGTH CONTROL DEVICE

BACKGROUND OF THE INVENTION

1. Field of the Invention

The present invention relates to a semiconductor laser wavelength control device for use in optical communication systems or the like to keep constant the emission wavelength of the semiconductor laser.

2. Description of the Related Art

Known semiconductor laser wavelength control devices include one in which the emission wavelength of the semiconductor laser is kept constant by controlling the temperature of the semiconductor laser. A semiconductor laser wavelength control device of this type will be described below with reference to FIG. 1.

FIG. 1 is a block diagram showing the configuration of the conventional semiconductor laser wavelength control device (with divider).

The semiconductor laser wavelength control device shown in FIG. 1 is configured of a laser diode 1, a thermoelectric cooler (TEC) 2, an optical splitter 3, a first photoelectric converter 4, a light intensity reference generating unit 5, an automatic optical power control circuit 6, a wavelength filter 7, a second photoelectric converter 8, a wavelength control target generating unit 9, a divider 10a and a temperature control circuit 11.

In this configuration, first the optical output signal of the laser diode 1 is split into two optical outputs A and B by using the optical splitter 3. The optical output A, one of these split outputs, is entered into the first photoelectric converter 4, where it is converted into an electric signal VPD1 according to its light intensity.

The electric signal VPD1 here is a signal representing the optical output intensity of the laser diode 1, which is a semiconductor laser. A semiconductor laser device used for optical communication, for instance, requires restraint on the fluctuations of the average optical output intensity of the semiconductor laser, and this requirement is met by the use of the automatic optical power control circuit 6 employing auto power control (APC).

The automatic optical power control circuit 6 compares the electric signal VPD1 supplied from the first photoelectric converter 4 and an optical output intensity control target REF1 supplied from the light intensity reference generating unit 5 and, by controlling an optical output intensity control current to the laser diode 1 as to reduce the difference between them to zero, keeps the optical output intensity from the laser diode 1 constant.

On the other hand, the other optical output B of the two split outputs from the optical splitter 3 is entered into the second photoelectric converter 8 after passing the wavelength filter 7 whose light transmissivity is dependent on the optical wavelength. An electric signal VPD2 supplied from the second photoelectric converter 8 is a signal matching the light intensity of the optical output B of the laser diode 1 having passed the wavelength filter 7, and is dependent on both the optical output intensity and the optical wavelength.

In order to obtain a desired wavelength from the laser diode 1, it is necessary to keep the ratio between the electric signal VPD2 and the electric signal VPD1 supplied from the first photoelectric converter 4 constant by varying the temperature of the laser diode 1 according to the electric signal VPD2 supplied from the second photoelectric converter 8.

Logically, in order to obtain a constant wavelength, the result of division of the electric signal VPD2 by the electric signal VPD1 (VPD2/VPD1) should be kept constant all the time.

To meet this requirement, the divider 10a is provided. The electric signal VPD2 and the electric signal VPD1 are entered into the divider 10a to compute VPD2/VPD1, and the result of this division is supplied to the temperature control circuit 11 as VOUT.

The temperature control circuit 11 controls the temperature of the laser diode 1 by regulating the temperature of the thermoelectric cooler 2, which may be a Peltier element the like, as to equalize VOUT to a wavelength control target REF2 supplied from the wavelength control target generating unit 9.

The temperature of the laser diode 1 is kept constant in this way. As the wavelength of the laser diode 1, namely the semiconductor laser is heavily dependent on the temperature of the semiconductor laser, wavelength stability can be secured for the semiconductor laser by keeping the temperature constant. Further, by adjusting the wavelength control target REF2, a desired wavelength can be obtained. In other words, in the semiconductor laser wavelength control device described above, VPD2/VPD1 can be expressed in the following equation:

$$VPD2/VPD1 = REF2$$

By keeping this relationship, a constant wavelength can be obtained. One of such conventional devices is described in the Japanese Patent Laid-Open No. 2001-7438 specification, for instance.

The overall reaction rate is determined as a result of the reaction rate of the thermoelectric cooler and the thermal capacity of the object of control. In a laser module for optical transmission or the like, these reaction rates can be approximated to a low pass filter (LPF), whose cut-off frequency $f_c$ is at a very low level, ranging between 0.01 Hz and 0.1 Hz approximately.

Where a thermoelectric cooler and a control circuit are to be configured of feedback circuits, the feedback loop requires a sufficient low frequency (DC) gain in order to make the temperature of the object of control identical with the target temperature. The error quantity of a system is usually proportional to the reciprocal of the gain of the loop. Where the ambient temperature is constant and the target temperature is constant, the error quantity of the system is determined by the gain in DC.

For this reason, the thermoelectric cooler and the feedback circuit to control it require consideration for securing stability and a sufficient DC gain of the loop of the whole system. Furthermore, since there are significant differences among individual thermoelectric coolers and changing the type of cooler would expand the range of the cut-off frequency $f_c$, fluctuations in cut-off frequency $f_c$ should also be taken into account.

Conventional control systems using an object of control having this low frequency characteristic include the analog control system and the PID control system.

The analog control system, as shown in FIG. 2, is configured of a high gain stage 91 for raising the DC gain and an LPF 92.

The transmission characteristic H(s) shown in FIG. 2 in the working of this system is represented by the following Expression (1):

$$H(s) = [A/RC] \cdot \{1/(s+1/RC)\} \qquad (1)$$

where A is the gain.

In order to stabilize the whole loop, a phase margin should be secured. If the pole of the control circuit is sufficiently higher in frequency than the cut-off frequency $f_c$ and sufficiently higher than the frequency $f_c$ at which the open loop gain of the whole loop becomes 1, a phase margin can be secured.

However, this means that a large control signal of a high frequency is applied to the object of control and, though the output signal from the object of control is smoothed by the LPF, wild variations will occur in the object of control, which are undesirable. Therefore, the pole is set lower than or close to the cut-off frequency $f_c$. As this results in a second loop together with the cut-off frequency $f_c$ of an electrothermal conversion element, the phase margin will pose a problem. As shown in FIG. 3, there is used a system to which a phase compensation circuit is added.

The transmission characteristic H(s) of the circuit shown in FIG. 3 is represented by the following Expression (2):

(Formula 1)

$$H(s) = \frac{AR_2}{R_1 + R_2} \cdot \frac{s + \frac{1}{R_2 C}}{s + \frac{1}{(R_1 + R_2)C}} \quad (2)$$

According to the PID control system, as shown in FIG. 4, the control characteristic is determined with a coefficient having three terms including a proportional term P, an integral term I and a differential term D as parameters. PID control has a high degree of freedom and is versatile. To determine the PID parameters, approximate values, namely initial setting, are determined by using an adjustment law on the basis of rough characteristics of the object of control. However, this initial setting does not always provide a fully satisfactory control characteristic, but it is often necessary to read just the parameters while controlling the object of control in this manner of control and watching the actual control characteristic. Regarding the stability of the loop, too, the parameters should be adjusted to settle the control quantity and the operation quantity to constant levels while performing actual control on the step response and the like (see for instance The Institute of Systems, Control and Information Engineers, PID Control, pp. 16-38, Asakura Shoten, September, 2002 (in Japanese)).

However, where the frequency characteristic of the object of control has a low LPF characteristic, the cut-off frequency $f_c$ is as low as $f_c$<0.1 Hz. As the conventional analog control system shown in FIG. 3 requires a sufficiently lower phase compensation than the cut-off frequency $f_c$, the RC constant takes on a high value, entailing an unsolved problem of difficulty of size reduction and large scale integration.

There is another unsolved problem of a long time taken for stabilization on account of a very low time constant. Furthermore, the cut-off frequency $f_c$ varies from element to element, which is the object of control, and the analog circuit itself involves no little fluctuation, making it necessary to adjust individual elements for stabilization of the whole loop, which poses an unsolved problem in productivity.

Moreover, as the control characteristic obtained for the conventional PID control system described above is evaluated with actual hardware, and the parameters should be adjusted accordingly, the differences from element to element make it difficult to determine the parameters, and accordingly the development of a design takes a long time, which is another unsolved problem. Further, when any element is to be changed to one of another type, the parameters have to be redesigned, entailing still another unsolved problem of requirement for many additional man-hours spent on development.

Next will be described the configuration of a semiconductor laser wavelength control device which does not use the divider 10a shown in FIG. 5. It may be noted here that parts shown in FIG. 5 having counterparts in FIG. 1 will be denoted by respectively the same signs, and their description will be dispensed with.

The semiconductor laser wavelength control device shown in FIG. 5 differs from the device shown in FIG. 1 in the use of a subtractor 10 in place of the divider 10a. Further, the wavelength control target generating unit 9 in this FIG. 5 is supposed to supply the target value of VPD2-VPD1 as the wavelength control target value REF2.

Thus, the subtractor 10 subtracts the electric signal VPD1 from the electric signal VPD2, and the result is supplied to the temperature control circuit 11 as VOUT. The temperature control circuit 11 controls the temperature of the laser diode 1 by regulating the temperature of the thermoelectric cooler 2 as to equalize VOUT to the wavelength control target value REF2 generated by the wavelength control target value generating unit 9. Conventional devices of this kind include, for instance, what is disclosed in the Japanese Patent Laid-Open No. 2002-270954 specification.

However, whereas the conventional semiconductor laser wavelength control device shown in FIG. 1 uses the divider 10a, the large circuit scale of this divider 10a invites a problem of expanding the overall size of the device.

Further, as both VPD2 and VPD1 which are divided by the divider 11a vary at a fixed increase rate, division of the two signals makes it possible to keep the wavelength constant as indicated by a curve 21 shown in FIG. 6. FIG. 6 shows the relationship of dependence between VPD2/VPD1 and the electric signal VPD1 supplied from the first photoelectric converter 4.

However, where VPD2 cannot be divided by VPD1 without a remainder, this remainder will give rise to a setting error, entailing a problem that the emission wavelength of the laser diode 1 cannot be controlled at a constant value.

The semiconductor laser wavelength control device shown in FIG. 5 on the other hand, as it uses the subtractor 10 in place of the divider 10a, can solve the aforementioned problems of the expanded circuit scale and the setting error due to the indivisible remainder.

In the configuration using the subtractor 10, as the wavelength control target REF2 is equal to VPD2-VPD1, VPD2/VPD1 will be as represented by the next Expression (3):

$$VPD2/VPD1 = (VPD1 + REF2)/VPD1 \quad (3)$$
$$= 1 + (REF2/VPD1)$$

As indicated by this equation (3), in order to keep the wavelength constant, the electric signal VPD1 supplied from the first photoelectric converter 4 should be kept constant.

The reason is that, where VPD2-VPD1 is calculated by using the subtractor 10, when both signals vary at a fixed increase rate, there arises a difference between the varied level of VPD2 and that of VPD1, and this difference is calculated. For instance, if VPD2=2 and VPD1=1 have trebled each, they will be 6 and 3, respectively, and the calculation of 6−3 will give a different result from 2−1.

In other words, when the electric signal VPD1 has varied, there arises an error in the calculation of the electric signals VPD2 and VPD1, and it becomes impossible to keep the wavelength constant as indicated by a curve 22 in FIG. 6. For this reason, the wavelength is kept constant by having the automatic optical power control circuit 6 restrain the variations of the electric signal VPD1.

However, there is a problem that, when the deterioration of the laser diode 1 over time causes the optical output intensity control current required by the laser diode 1 to surpass the controllable range of the automatic optical power control circuit 6, the wavelength cannot be kept constant.

On the other hand, depending on the purpose for which the semiconductor laser wavelength control device is to be used, the optical output intensity of the laser diode 1 should be continuously varied. However, when the optical output intensity is continuously varied, there arises an error in the calculation by the subtractor 10 as stated above, resulting in a problem of impossibility to keep the wavelength constant.

In view of these problems, an object of the present invention is to provide a semiconductor laser wavelength control device which can control the optical wavelength to remain constant even if the optical output intensity of the semiconductor laser varies and can be reduced in overall size.

Another object of the invention is to provide a temperature control device which, where the object of wavelength control has a frequency characteristic of a low LPF characteristic, can be sufficiently stable and easy to design and permits large scale integration even if the possibility of individual differences and type change of the object of control are taken into consideration.

SUMMARY OF THE INVENTION

According to the present invention, there is provided a semiconductor laser wavelength control device comprising a semiconductor laser, an optical filter which receives light from the semiconductor laser and whose transmissivity varies with the wavelength of the light, and control means which controls the optical wavelength of the semiconductor laser to a prescribed wavelength by driving a temperature control unit to control the temperature of the semiconductor laser, wherein the control means has a low pass characteristic, with a first photoelectric conversion signal resulting from the conversion of light having passed the optical filter into an electric signal and a target for the semiconductor laser to emit light of the prescribed wavelength being entered as inputs, supplies a control signal for driving the temperature control unit, and the control means is set that a greater one out of a plurality of poles has a higher frequency than the cut-off frequency of the object of control and the zero point has a lower frequency than the cut-off frequency of the object of control.

This control means may comprise comparing means for comparing the first photoelectric conversion signal and the target, and arithmetic operation means which is set to compute the output of the comparing means as to cause a greater one out of a plurality of poles to have a higher frequency than the cut-off frequency of the object of control and the zero point to have a lower frequency than the cut-off frequency of the object of control.

The arithmetic operation means may comprise proportional means which multiplies the difference between the output of the comparing means and a feedback signal by an integer, first integrating means which, after integrating the output of the proportional means, feeds back the integrated output as the feedback signal, additional signal generating means which multiplies the output of the comparing means by the reciprocal of an integer and adding the result to the output of the proportional means, and second integrating means which integrates the output of the additional signal generating means and supplies the integrated output as the control signal.

The arithmetic operation means may comprise proportional means which multiplies the difference between the output of the comparing means and a feedback signal by K (K is an integer not smaller than 1), first integrating means which, after integrating the output of the proportional means, multiplies the integrated output by 1/L (L is an integer not smaller than 1) and feeds the multiplied output as the feedback signal, additional signal generating means which multiplies the output of the comparing means by 1/N (N is an integer not smaller than 1) and adds the multiplied output to the output of the proportional means, and second integrating means which, after multiplying by M the sum of the output of the additional signal generating means and the output of the proportional means, integrates the multiplied sum and supplies the integrated multiple as the control signal, and wherein the value of the K and that of the L are set that a greater one out of a plurality of poles has a higher frequency than the cut-off frequency of the object of control, the value of the N is set that the zero point has a lower frequency than the cut-off frequency of the object of control, and the value of the M is set that the gain from a low frequency range to the cut-off frequency of the object of control is at least 1.

The additional signal generating means may, when the cumulative sum of the output of the comparing means is greater than N−1 (N is an integer not smaller than 1), subtract N−1 from the cumulative sum and make +1 the signal to be added to the output of the proportional means or, when the cumulative sum is smaller than −N, add N to the cumulative sum and make −1 the signal to be added to the output of the proportional means.

The additional signal generating means may, when the cumulative sum of the output of the comparing means is greater than N (N is an integer not smaller than 1), subtract N from the cumulative sum and make +1 the signal to be added to the output of the proportional means or, when the cumulative sum is smaller than −N, add N to the cumulative sum and make −1 the signal to be added to the output of the proportional means.

The arithmetic operation means may be configured that the respective values of K, M, N and L are set differently between the time of start-up and the period of stabilized operation.

The semiconductor laser wavelength control device may further comprise D/A conversion means which subjects the output of the second integrating means to D/A conversion, wherein the comparing means may be configured as to subject the first photoelectric conversion signal to A/D conversion and to detect the difference between the converted signal and the target.

The semiconductor laser wavelength control device may further comprise D/A conversion means which subjects the output of the second integrating means to D/A conversion, wherein the comparing means may be configured as to detect the difference between the first photoelectric conversion signal and the target and to subject this difference to A/D conversion.

The semiconductor laser wavelength control device may further comprise D/A conversion means which subjects the output of the second integrating means to D/A conversion, wherein the comparing means is configured as to connect the first photoelectric conversion signal to the positive pole input of a comparator and to connect the target to the negative pole input of the comparator.

The semiconductor laser wavelength control device may further comprise second control means which controls an optical output intensity control current to be supplied to the semiconductor laser as to equalize a second photoelectric conversion signal to the optical output intensity control target, the second photoelectric conversion signal is an electric signal converted from the light beams resulting from the branching of the light supplied from the semiconductor laser, the optical output intensity control target which controls the optical output intensity of the semiconductor laser to a prescribed intensity, wherein the second control means comprises first generating means for generating a wavelength control target for controlling the optical wavelength of the semiconductor laser to a prescribed wavelength, second generating means for generating a conversion coefficient corresponding to a transmissivity for the desired wavelength of the optical filter, subtracting means for subtracting the optical output intensity control target from the second photoelectric conversion signal to figure out the quantity of variation of the optical output intensity, multiplying means for multiplying the conversion coefficient by the quantity of variation of the optical output intensity to figure out a correction value for the wavelength control target matching the quantity of variation of the optical output intensity, and adding means for adding the wavelength control target to the correction value for correcting the wavelength control target with the correction value, wherein the target corrected by the adding means be entered into the control means.

The first photoelectric conversion signal may be a signal resulting from the passage of the other of the branched lights through the optical filter to be converted into an electric signal, and the conversion coefficient, a value obtained by dividing the first photoelectric conversion signal by the second photoelectric conversion signal in a condition where the semiconductor laser has the desired optical output intensity and wavelength.

According to the invention, there may also be provided a semiconductor laser wavelength control device wherein an optical output intensity control current to be supplied to a semiconductor laser is controlled as to equalize a second photoelectric conversion signal, which is an electric signal converted from one of the light beams resulting from the branching of the light supplied from the semiconductor laser, and an optical output intensity control target for controlling the optical output intensity of the semiconductor laser to a prescribed intensity, further comprising first generating means for generating a wavelength control target for controlling the optical wavelength of the semiconductor laser to a prescribed wavelength; second generating means for generating as a conversion coefficient a value obtained by dividing a first photoelectric conversion signal, which is an electric signal converted from the other of the branched light beams having passed an optical filter whose transmissivity is dependent on the wavelength of light in a condition where the semiconductor laser has the desired optical output intensity and wavelength, by the second photoelectric conversion signal; subtracting means for subtracting the optical output intensity control target from the second photoelectric conversion signal to figure out the quantity of variation of the optical output intensity; multiplying means for multiplying the conversion coefficient by the quantity of variation of the optical output intensity to figure out a correction value for the wavelength control target matching the quantity of variation of the optical output intensity; and adding means for adding the wavelength control target to the correction value for correcting the wavelength control target with the correction value for the wavelength control target, wherein the temperature of the semiconductor laser is controlled as to equalize the first photoelectric conversion signal to the target corrected by the adding means. According to this configuration of the invention, where the cut-off frequency of the object of control has a low LPF characteristic, since the parameters of the control circuit are determined with the cut-off frequency of the object of control taken into consideration, the control circuit can be sufficiently stable and permits ready large scale integration.

Also, as the zero point, poles and gain are set while varying the parameters of the control circuit with the cut-off frequency of the object of control taken into consideration with due regard for fluctuations in the cut-off frequency owing to differences among individual objects of control and a change in the type of element, which is the object of control, the control circuit can be designed to secure a phase margin for stabilizing the whole loop. Therefore, a fully stable control circuit can be readily designed, and the temperature of the laser module can be stably controlled without spending many man-hours on development.

Moreover, even when the type of element is to be altered, parameters need not be redesigned, and this also contributes to reducing the man-hours on development.

Furthermore, the parameters of the control circuit are adjusted that a greater one out of a plurality of poles has a higher frequency than the cut-off frequency of the object of control, the zero point has a lower frequency than the cut-off frequency of the object of control, and the gain from a low frequency range to the cut-off frequency of the object of control is at least 1, it is possible to design the control circuit as to secure a phase margin for stabilizing the whole loop. At the same time, by varying the parameters of the control circuit between the time of start-up and the period of stabilized operation, the time taken to achieve convergence to the stable state can be reduced.

Further, by digitizing the control circuit, it is made possible to eliminate fluctuations of the control circuit itself, and to readily realize large scale integration, and the configuration of the control circuit using an add accumulator serves to restrain the increase in the number of digits in computation, the control circuit can be reduced in size, which is an advantage in large scale integration.

On the other hand, when the optical output intensity control current required by the semiconductor laser has surpassed the controllable range of control means for generating the optical output intensity control current, or when the optical output intensity of the semiconductor laser is varied, even if the second photoelectric conversion signal varies, the quotient of the division of the first photoelectric conversion signal by the second photoelectric conversion signal is the conversion coefficient, which always is a fixed value. Therefore, the output wavelength of the semiconductor laser can be kept constant.

Also, as the photoelectric conversion signal, which is an electric signal resulting from the conversion of the other of the branched light beams having passed the wavelength filter, which is dependent on the optical wavelength, and the quotient of division of the photoelectric conversion signal can be fixed values all the time without having to use a divider of a large circuit scale as in conventional cases, the output wavelength of the semiconductor laser can be kept constant.

Accordingly, the optical wavelength can be kept constant even if the optical output intensity of the semiconductor laser is varied, resulting in an advantage that the whole device can be reduced in size.

DETAILED DESCRIPTION OF THE INVENTION

Preferred embodiments of the present invention will be described in detail below with reference to drawings.

Figure 5:
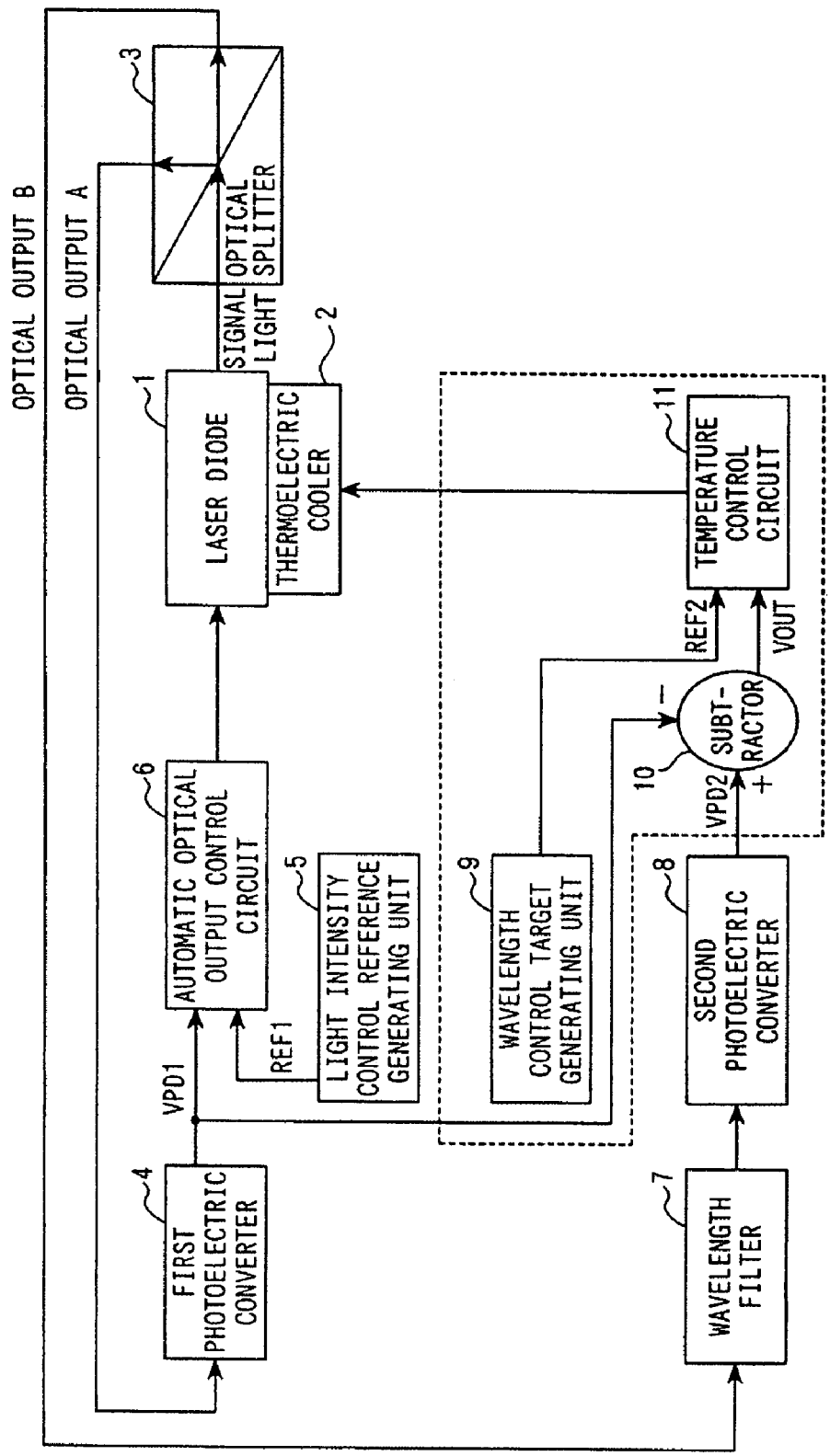
FIG. 5 is a block diagram showing the configuration of a conventional semiconductor laser wavelength control device (without divider)
Figure 6:
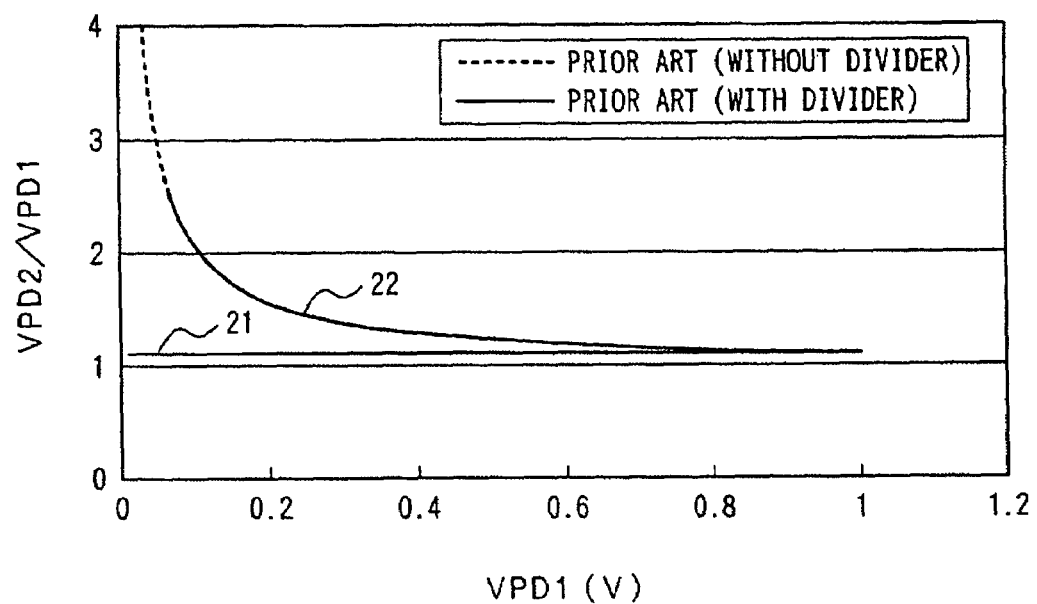
FIG. 6 shows the relationship of dependence between VPD2/VPD1 and the electric signal VPD1 supplied from the first photoelectric converter in the semiconductor laser wavelength control devices with and without divider shown in FIG. 1 and FIG. 5, respectively.
Figure 7:
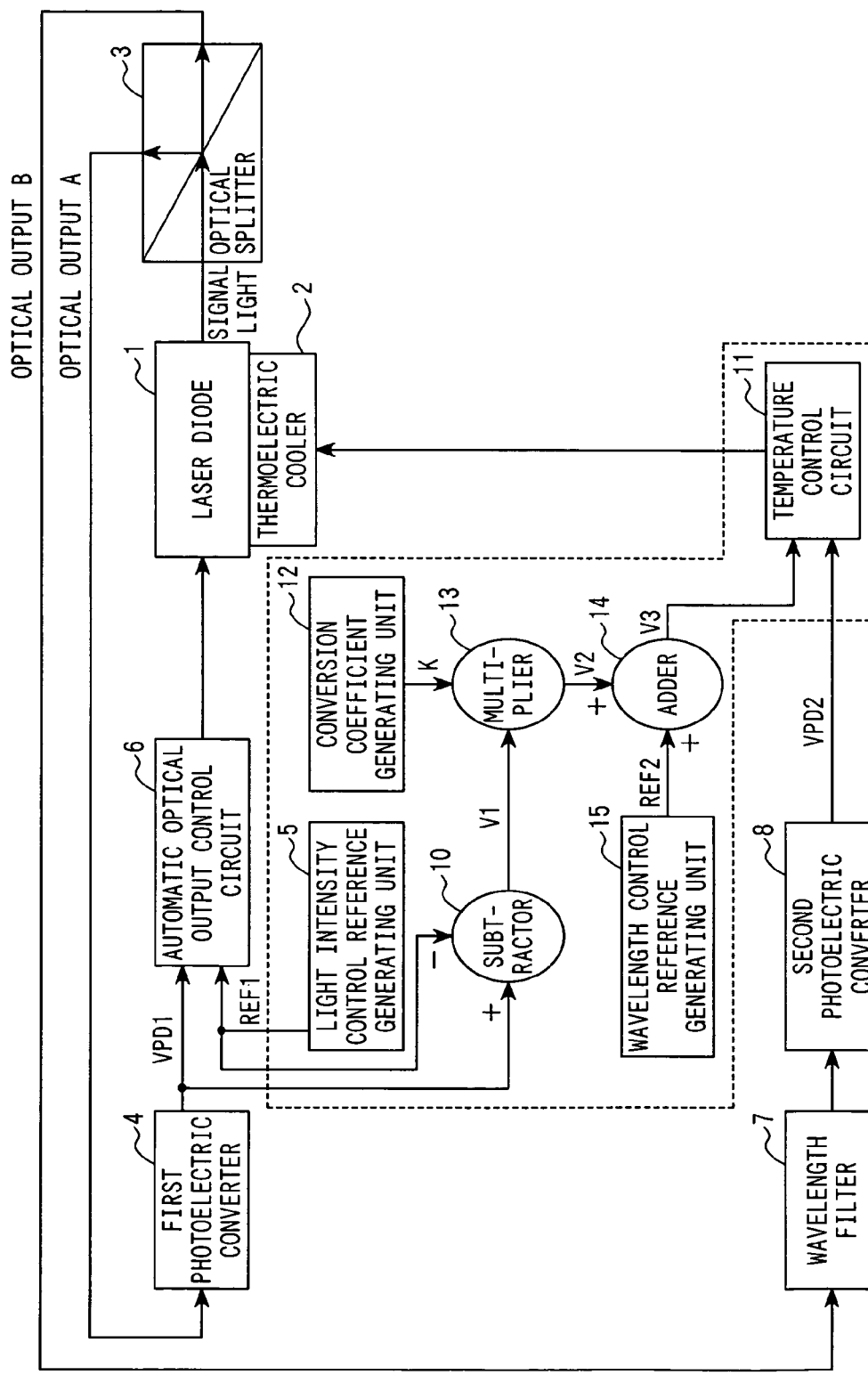
FIG. 7 is a block diagram showing the configuration of a semiconductor laser wavelength control device, which is a preferred embodiment of the invention.

FIG. 7 is a block diagram showing the configuration of a semiconductor laser wavelength control device, which is one of the preferred embodiments of the invention. In the preferred embodiment shown in FIG. 7, constituent elements having counterparts in the conventional device shown in FIG. 5 will be denoted by respectively the same signs, and the description of elements applied for the same uses will be dispensed with.

The semiconductor laser wavelength control device shown in FIG. 7 comprises a laser diode 1 as a semiconductor laser, a thermoelectric cooler 2, an optical splitter 3, a first photoelectric converter 4, a light intensity reference generating unit 5, an automatic optical power control circuit 6, a wavelength filter 7, a second photoelectric converter 8, a subtractor 10 as subtracting means, a temperature control circuit 11 as control means, a conversion coefficient generating unit 12 as second generating means, a multiplier 13 as multiplying means, an adder 14 as adding means and a wavelength control reference generating unit 15 as first generating means.

These subtractor 10, conversion coefficient generating unit 12, multiplier 13, adder 14 and wavelength control reference generating unit 15 constitute second control means.

Next will be described these constituent elements.

As the thermoelectric cooler 2, a Peltier element is used for instance. The Peltier element is configured by joining a P-type semiconductor and an N-type semiconductor, both basically consisting of bismuth telluride, via a metal electrode. When an electric current is let flow from the N-type semiconductor to the P-type semiconductor, the joint between the P-type semiconductor and the N-type semiconductor electrons shifts from a high electron energy state to a low energy state and absorbs the oscillation energy of the crystal lattice around, resulting in an increase in heat absorption and a drop in temperature.

Conversely, when a current is let flow from the P-type semiconductor to the N-type semiconductor, the joint between them shifts from a low electron energy state to a high energy state and supplies oscillation energy to the crystal lattice around, resulting in a decrease in heat absorption and a rise in temperature.

Therefore, temperature control can be performed by controlling the direction and amperage of the current let flow to a Peltier element 82.

Figure 15:
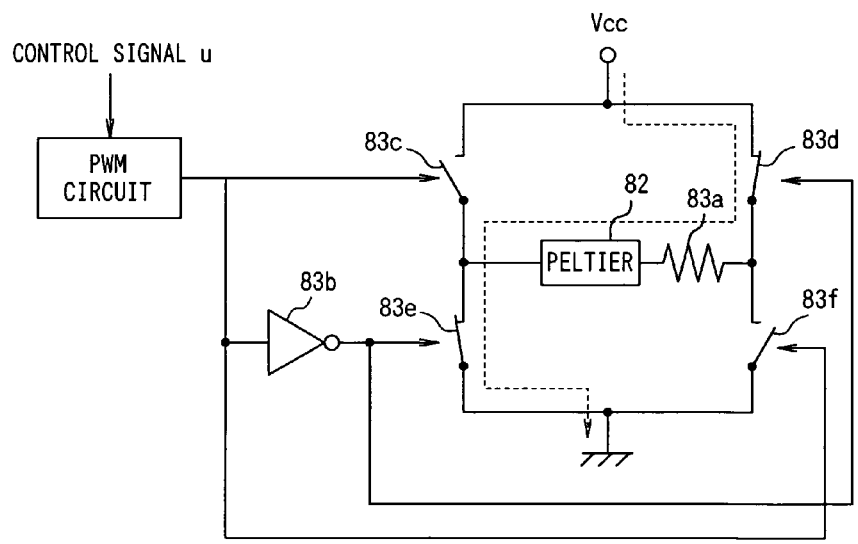
FIG. 15 shows the configuration of a Peltier element drive circuit.

A Peltier element drive circuit 83 is configured, for instance, in a pulse width modulation formula which controls the heat absorption and emission of the Peltier element by controlling the duty ratio of the drive pulse as shown in FIG. 15. In the drawing, the PWM circuit is a pulse width modulation circuit, which is configured as to supply a drive pulse according to a control signal u. In the drawing, reference numeral 82 denotes the Peltier element; 83a, a resistor connected to the Peltier element in series; 83b, an inverter to invert the logical level of the drive pulse; and 83c through 83f, switches which, for instance, are opened when the logical level of the supplied pulse is "1" and short-circuited when the logical level of the supplied pulse is "0".

Switches 83d and 83f connected in series, and switches 83e and 83c also connected in series are connected in parallel, and the middle point between the switches 83d and 83f and that between the switches 83e and 83c are connected to the Peltier element 82 and the resistor 83a connected in series.

The operations of the switches being defined as stated above, FIG. 15 shows a case in which the logical level of the drive pulse is "1". Thus, as the logical level of the inverter 83b is "0" when the logical level of the drive pulse is "1", the switches 83e and 83d are short-circuited and the switches 83c and 83f are opened with the result that a Peltier current then flows in the direction of the arrow in FIG. 15.

Or, as the logical level of the inverter 83b turns "1" when the logical level of the drive pulse turns "0", the switches 83c and 83f are short-circuited and the switches 83e and 83d are opened with the result that a Peltier current then flows in the direction reverse to the direction of the arrow in FIG. 15.

Therefore, in this system where the direction of the current in the Peltier element 82 is controlled with the drive pulse, when the duty ratio of the drive pulse is 50% the increase and the decrease in heat absorption are balanced, and there is no temperature variation in the joint. When the duty ratio of the drive pulse is either raised or lowered from 50%, the temperature in the joint rises or drops according to this increase or decrease in duty ratio.

In this way, the temperature of the laser diode can be kept constant at the set target temperature by controlling the duty ratio of the drive pulse according to the control signal u and there by controlling the temperature of the Peltier element 82. The whole device which controls the temperature of the laser diode with this Peltier element 82 constitutes the temperature control device.

Now in such a laser module, the reaction characteristic can be approximated to the low pass filter (LPF), whose cut-off frequency $f_c$ is as low as approximately 0.01 Hz to 0.1 Hz. This cut-off frequency $f_c$ may vary from one electrothermal conversion element to another.

Therefore, the parameters are set as to make a control circuit supplying the control signal u a fully stable one, with the individual differences in the cut-off frequency $f_c$ of the element to be controlled as will be described below.

The light intensity reference generating unit 5 supplies an optical output intensity control target REF1 to the automatic optical power control circuit 6 and the subtractor 10.

The wavelength control reference generating unit 15 supplies a wavelength control target REF2 to the adder 14.

The conversion coefficient generating unit 12, when the laser diode 1 has been adjusted to the desired optical output intensity and wavelength in the adjustment process, divides the signal VPD2 representing the optical intensity after the optical output of the laser diode 1 has passed the wavelength filter 7 as a first photoelectric conversion signal by the signal VPD1 representing the optical output intensity of the laser diode 1 as a second photoelectric conversion signal, generates the result of this division as a fixed value K, and supplies it to the multiplier 13. Hereinafter, VPD1 will be referred to as the optical output intensity indicating signal, VPD2 as the filter-passed optical output intensity indicating signal, and K as the conversion coefficient K.

The conversion coefficient K here is represented by the following Expression (4):

$$K = REF2/REF1 \quad (4)$$

The automatic optical power control circuit 6 keeps the optical output intensity of the laser diode 1 constant by controlling the optical output intensity control current supplied to the laser diode 1 as to equalize the optical output intensity indicating signal VPD1 and the optical intensity control target REF1.

Hereupon, VPD1(t0) is represented by the following Expression (5) where the initial values of VPD1 and VPD2 are respectively represented by VPD1(t0) and VPD2(t0):

$$VPD1(t0) = REF1 \quad (5)$$

The subtractor 10 figures out the variation V1 of the optical output intensity by subtracting the optical output intensity control target REF1 from the optical output intensity indicating signal VPD1. In the initial state, it calculates $$V1 = VPD1(t0) - REF1 = 0.$$

The multiplier 13, in order to figure out a correction value for the wavelength control target REF2 matching the variation V1 of the optical output intensity, multiplies the variation V1 of the optical output intensity by the conversion coefficient K, and uses the result as the correction value V2 for the wavelength control target REF2. In the initial state, it calculates $V2 = K \times V1 = 0$.

The adder 14, in order to correct the wavelength control target REF2 with the correction value V2 for the wavelength control target REF2, calculates V2+REF2, and supplies the result to the temperature control circuit 11 as the corrected wavelength control target V3. In the initial state, it calculates V3=REF2+V2=REF2.

The temperature control circuit 11 controls the temperature of the laser diode 1 by controlling the temperature of the thermoelectric cooler 2 as to equalize the filter-passed optical output intensity indicating signal VPD2 to the corrected wavelength control target V3. In the initial state, VPD2(t0) is represented by the following Expression (6):

$$VPD2(t0) = V3 = REF2 \quad (6)$$

Here, from Expressions (5) and (6) stated above, VPD2(t0)/VPD1(t0) can be expressed as follows, and accordingly the wavelength can be kept constant:

$$\{VPD2(t0)/VPD1(t0)\} = REF2/REF1 = K \quad (7)$$

The operations of the semiconductor laser wavelength control device having this configuration will be described below.

First will be described how it operates when the deterioration of the laser diode 1 over time has caused the optical output intensity control current required for the laser diode 1 to surpass the control range of the automatic optical power control circuit 6 and the optical output intensity indicating signal VPD1 varies accordingly.

VPD1 and VPD2 after the deterioration over time are represented by VPD1(t1) and VPD2(t1), respectively.

When the optical output intensity indicating signal VPD1(t1) has varied by $\Delta VPD1$ from VPD1(t0), $\Delta VPD1 = VPD1(t1) - VPD1(t0)$ holds.

This variation $\Delta VPD1$ is detected by the subtractor 10. Thus, the subtractor 10 gives the result of calculation of $$V1(t1) = VPD1(t1) - REF1.$$

From Expression (5) above, the result of calculation here is:

$$V1(t1) = VPD1(t1) - REF1 = VPD1(t1) - VPD1(t0) = \Delta VPD1 \quad (8)$$

Next, the multiplier 13 multiplies that variation V1(t1) of the optical output intensity by the conversion coefficient K as expressed by the following Expression (9), and the correction value V2 of the wavelength control target REF2 is obtained as a result.

$$V2(t1) = V1(t1) \times K = \Delta VPD1 \times K \quad (9)$$

Then, the adder 14 adds the wavelength control target REF2 to that correction value V2(t1) of the wavelength control target REF2, and the corrected wavelength control target V3, which is the result of this addition, figured out and supplied to the temperature control circuit 11. The temperature control circuit 11 controls the temperature of the laser diode 1 by controlling the temperature of the thermoelectric cooler 2 as to equalize the filter-passed optical output intensity indicating signal VPD2 to the corrected wavelength control target V3.

This can be numerically represented by the following Expressions (10) and (11):

$$VPD2(t1) = V3(t1)$$

$$V3(t1) = V2(t1) + REF2 = \Delta VPD1 \times K + REF2 \quad (10)$$

From Expressions (8) and (10) above, VPD1(t1) and VPD2(t1) are represented by:

$$VPD1(t1) = REF1 + \Delta VPD1$$

$$VPD2(t1) = REF2 + K \times \Delta VPD1$$

Further from Expression (4) above:

$$K = REF2/REF1$$

and accordingly the following holds:

$$[VPD2(t1)/VPD1(t1)] = (REF2 + K \times \Delta VPD1)/(REF1 + \Delta VPD1) = (K \times REF1 + K \times \Delta VPD1)/(REF1 + \Delta VPD1) = K \quad (11)$$

Here, as indicated by Expression (11) above, even though the optical output intensity indicating signal VPD1 varies when the deterioration of the laser diode 1 over time has caused the optical output intensity control current required for the laser diode 1 to surpass the control range of the automatic optical power control circuit 6, as the result of dividing VPD2 by VPD1 always takes on the fixed value K, the output wavelength of the laser diode 1 can be kept constant.

Next will be described the operation that takes place when the optical output intensity of the laser diode 1 is varied and the optical output intensity indicating signal VPD1 varies accordingly.

VPD1 and VPD2 after the optical output intensity of the laser diode 1 is varied are represented by VPD1(t2) and VPD2(t2), respectively.

When the optical output intensity of the laser diode 1 is varied, and the optical output intensity indicating signal VPD1(t2) varies by $\Delta VPD1$ from VPD1(t0), $\Delta VPD1 = VPD1(t2) - VPD1(t0)$ holds.

This variation $\Delta VPD1$ is detected by the subtractor 10. Thus, the calculation by the subtractor 10 gives a result of $V1(t2) = VPD1(t2) - REF1$.

Here, that calculation result according to Expression (5) above can be represented by:

$$V1(t2) = VPD1(t2) - REF1 = VPD1(t2) - VPD1(t0) = \Delta VPD1 \quad (12)$$

Next, the multiplier 13 multiplies that variation V1(t2) of the optical output intensity by the conversion coefficient K as expressed in the following Expression (13), and the correction value V2 for the wavelength control target REF2 is figured out as a result.

$$V2(t2) = V1(t2) \times K = \Delta VPD1 \times K \quad (13)$$

Then, the adder 14 adds the wavelength control target REF2 to that correction value V2(t2) for the wavelength control target REF2, and the corrected wavelength control target V3 resulting from this addition is figured out and supplied to the temperature control circuit 11. The temperature control circuit 11 controls the temperature of the laser diode 1 by controlling the temperature of the thermoelectric cooler 2 as to equalize the filter-passed optical output intensity indicating signal VPD2 to the corrected wavelength control target V3.

This can be numerically expressed in the following Expressions (14) and (15):

$$VPD2(t2) = V3(t2)$$

$$V3(t2) = V2(t2) + REF2 = \Delta VPD1 \times K + REF2 \quad (14)$$

From Expressions (8) and (10) above, VPD1(t2) and VPD2(t2) can be respectively rewritten into:

$$VPD1(t2) = REF1 + \Delta VPD1$$

$$VPD2(t2) = REF2 + K \times \Delta VPD1$$

and from Expression (4) above:

$$K = REF2/REF1$$

hence:

$$[VPD2(t2)/VPD1(t2)] = (REF2 + K \times \Delta VPD1)/(REF1 + \Delta VPD1) = (K \times REF1 + K \times \Delta VPD1)/(REF1 + \Delta VPD1) = K \quad (15)$$

As indicated by Expression (15) above, even though the optical output intensity indicating signal VPD1 varies as a result of the variation of the optical output intensity control current of the laser diode 1, the output wavelength of the laser diode 1 can be kept constant since the result of dividing VPD2 by VPD1 always takes on the fixed value K.

Figure 1:
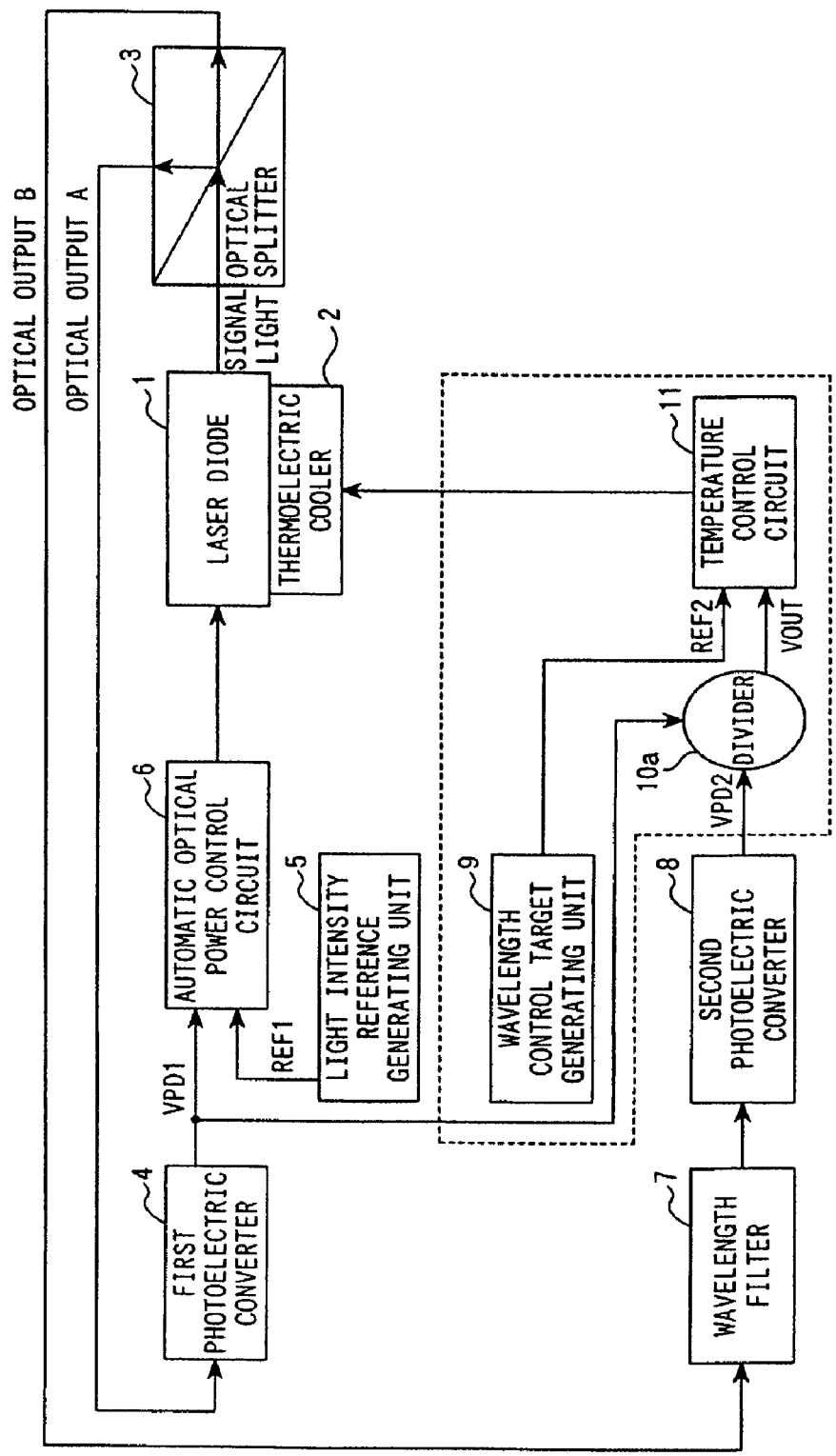
FIG. 1 is a block diagram showing the configuration of the conventional semiconductor laser wavelength control device (with divider)
Figure 2:
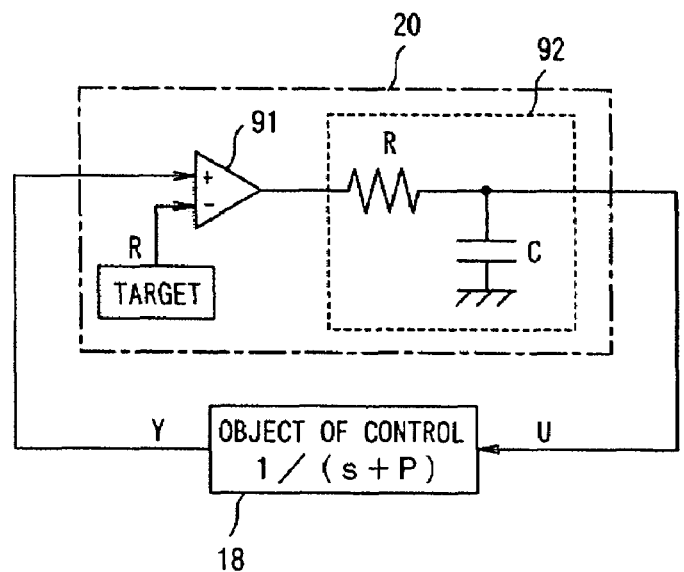
FIG. 2 shows a conventional analog control system.
Figure 3:
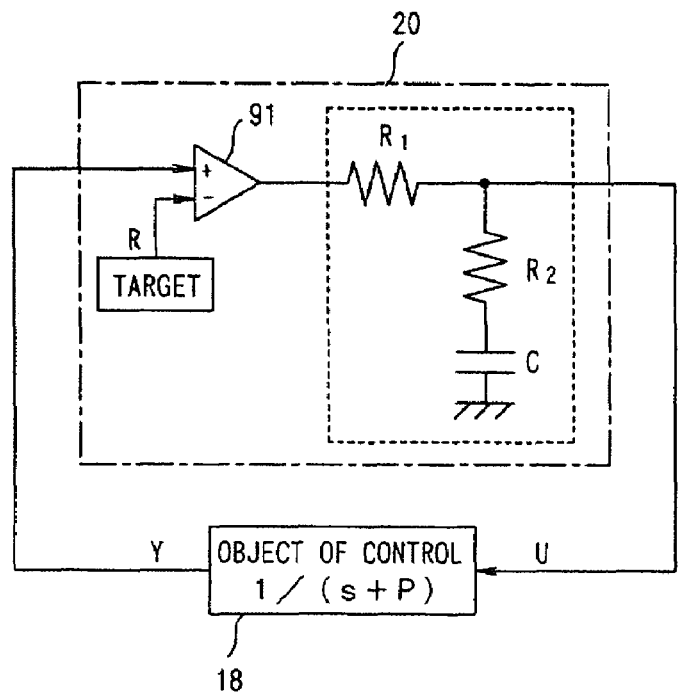
FIG. 3 shows another conventional analog control system.
Figure 4:
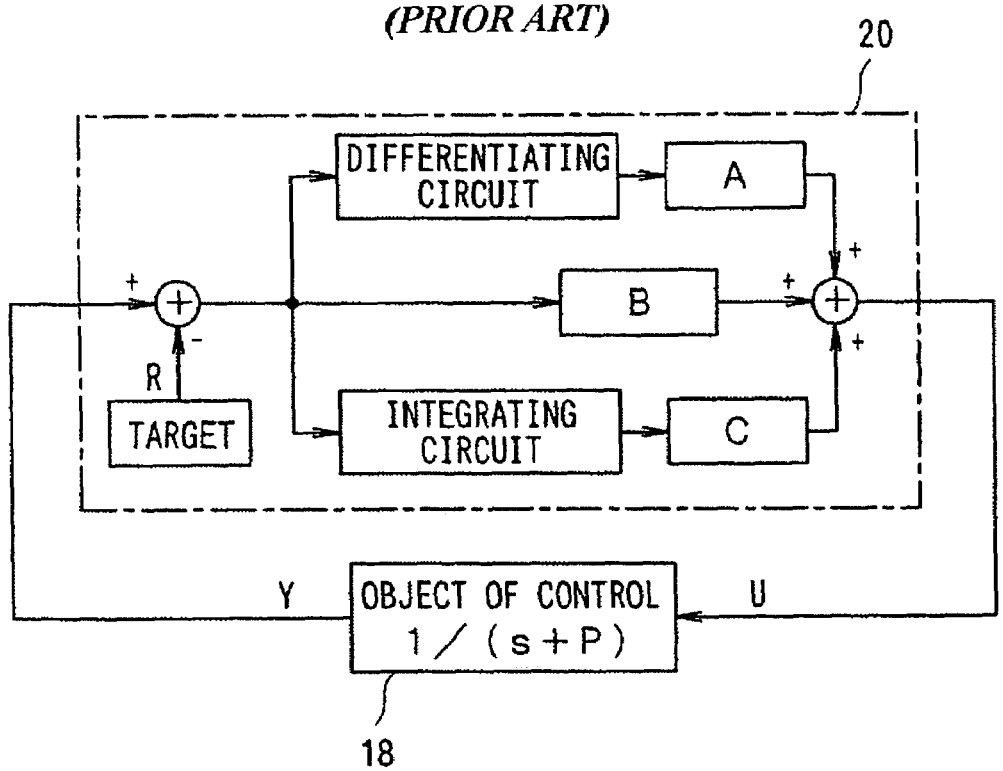
FIG. 4 shows a conventional PID control system.

As described above, the semiconductor laser wavelength control device embodying the invention in this mode can keep the output wavelength of the laser diode 1 constant without using the divider 10a, which is greater in circuit scale and use in the conventional device shown in FIG. 1. Therefore, the overall size of the semiconductor laser wavelength control device can be reduced correspondingly.

Moreover, as the divider 10a is not used, it is possible to prevent the occurrence of a setting error due to the indivisible remainder of the division of VPD2 by VPD1 where the divider 10a is used and the resultant inability to keep the emission wavelength of the laser diode 1 constant.

Also, even though the optical output intensity indicating signal VPD1 varies when the deterioration of the laser diode 1 over time has caused the optical output intensity control current required for the laser diode 1 to surpass the control range of the automatic optical power control circuit 6, as the result of dividing VPD2 by VPD1 always takes on the fixed value K, the output wavelength of the laser diode 1 can be kept constant without having to use the divider 10a.

Furthermore, even though the optical output intensity indicating signal VPD1 is varied by altering the optical output intensity of the laser diode 1, as the result of VPD2/VPD1 always takes on the fixed value K, the output wavelength of the laser diode 1 can be kept constant without having to use the divider 10a.

Next, the temperature control circuit 11 will be described in detail.

Figure 8:
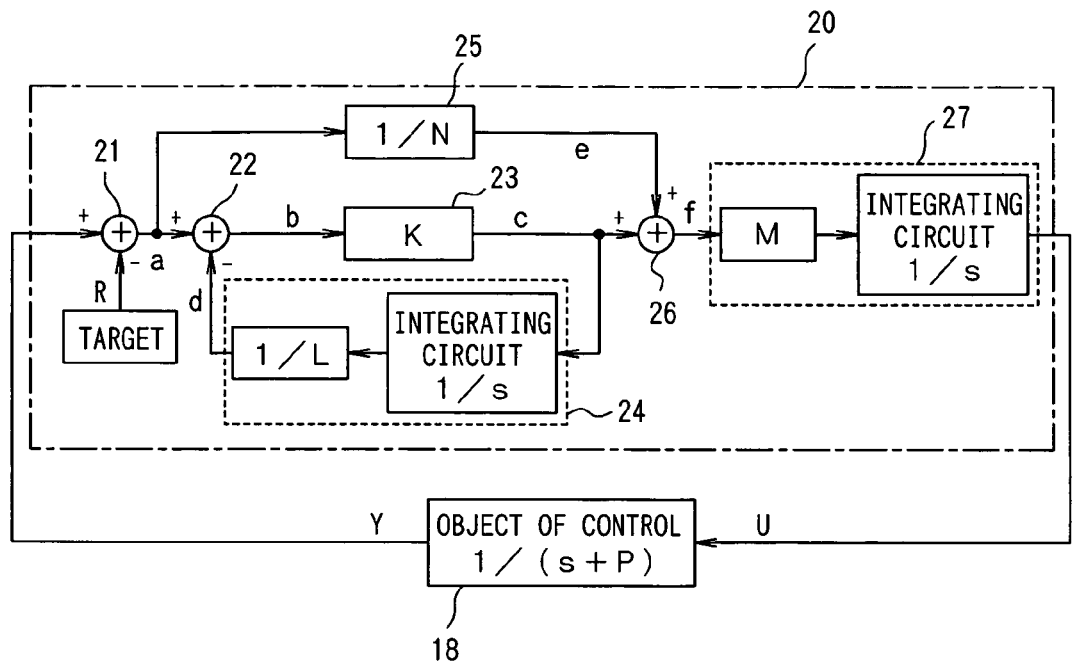
FIG. 8 shows a control circuit in the first preferred embodiment of the invention.

FIG. 8 schematically shows the configuration of the temperature control circuit 11 according to the invention, wherein reference numeral 18 denotes the object of control, and 20, a control circuit. The object of control 18 as the object to be controlled has a frequency characteristic of a low LPF characteristic. As an output signal Y from the object of control 18 is entered into the control circuit 20 and the control circuit 20 supplies a control signal U for controlling the characteristic of the object of control 18 to the object of control 18, there is formed a feedback loop. The whole system here configured of the laser diode, the temperature control device, the wavelength filter and the photoelectric converter matches the object of control 18.

In the control circuit 20, the difference between the output signal Y from the object of control 18 and a target R is figured out by an error detector 21 as comparing means, and this difference is thereafter used as a signal a. Next, a signal b is generated by a subtractor 22 by figuring out the difference signal between this signal a and a feedback signal d having undergone signal processing to be described afterwards, and a signal c is generated by a proportional circuit 23 as proportional means by multiplying the signal b by K. Then, the signal c is integrated by a first integrating circuit 24 as first integrating means, followed by multiplication by 1/L to generate the feedback signal d.

Also, a signal f is generated by an adder 26, which adds a signal resulting from multiplication by 1/N of the signal a by a 1/N multiplier circuit 25 as signal generating means and the signal c. After multiplying by M this signal f by a second integrating circuit 27 as second integrating means, the integrated signal is supplied as the control signal U.

The transmission characteristic H(s) of the control circuit 2 then is represented by the following Expression (16):

$$H(s) = \{(1+N)/N\} \cdot M \cdot (1/s) \cdot \{s + K/L \cdot 1/(1+NK)\}/(s+K/L) \quad (16)$$

From Expression (16) above, Poles ($P_1$, $P_2$) and Zero (Z) can be represented by the following set of Expressions (17):

$$P_1 = 0,$$

$$P_2 = K/L,$$

$$Z = K/L \cdot 1/(1+NK) \tag{17}$$

Figure 9:
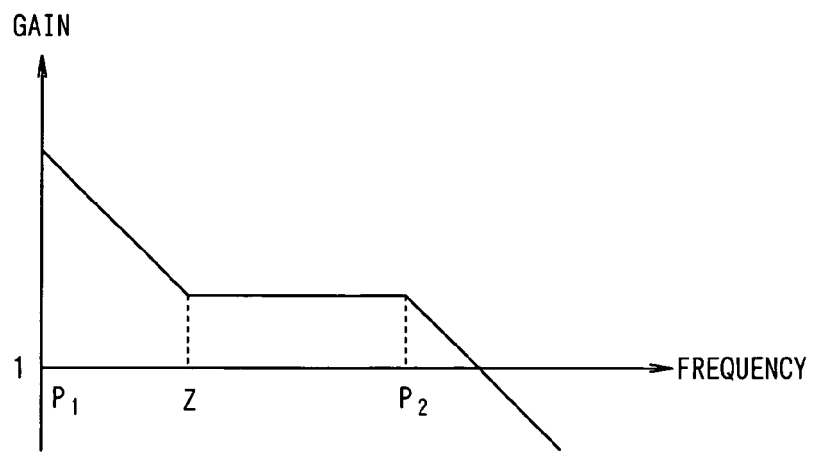
FIG. 9 shows the frequency-gain characteristic of the control circuit.

FIG. 9 shows the frequency-gain characteristic of the control circuit 20.

This control circuit 20 has an integration characteristic of 1/s to increase the DC gain, and has an infinitely large DC gain. Regarding the overall characteristic of the loop, it is preferable to secure a wide band for the whole loop in order to enhance the response speed. For this reason, setting is done to secure as far as practicable a gain of not less than 100% for the whole loop to the cut-off frequency $f_c$ of the LPF. If NK is sufficiently greater than 1, as (1+NK)/N can be approximated to K and the gain from Z to $P_2$ can be approximated to LM, the gain can be regulated by adjusting the value of M.

Figure 10:
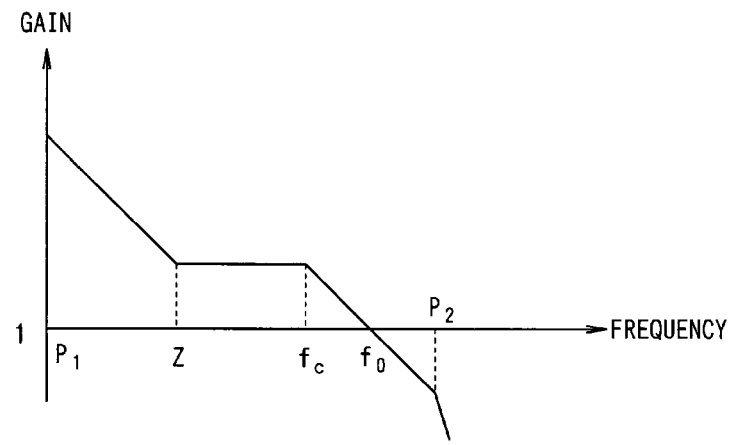
FIG. 10 shows the frequency-gain characteristic of the whole loop.

FIG. 10 shows the frequency-gain characteristic of the whole loop.

In order to stabilize the whole loop, it is necessary to secure a phase margin. The control circuit 20 has a Pole at the frequency of 0 Hz for the integral characteristic, where it takes on a state in which the phase has turned 90 degrees. As the object of control 18 is the LPF characteristic, the phase further turns at the cut-off frequency $f_c$ of this LPF, and therefore it is necessary to return the phase at Zero before the phase turns at the cut-off frequency $f_c$. To make this possible, Z has to be a frequency sufficiently lower than $f_c$.

Furthermore, as the phase turns at $P_2$ of the control circuit 20, $P_2$ should be a sufficiently higher frequency than the frequency $f_o$ at which the open loop gain of the whole loop becomes 1. If $P_2$ is at a sufficiently higher frequency than $f_o$, there will be no influence at the frequency $f_o$ of the phase variation at $P_2$, and the phase margin will be determined only by the phase variation at the cut-off frequency $f_c$, and accordingly the phase margin of the whole loop will be secured.

Since this $P_2$ is represented by Expression (17) stated above, it can be set to be higher than the cut-off frequency $f_c$ by adjusting K and L. Also, as K and L are set in this way, Z can be set to be lower than the cut-off frequency $f_c$ by adjusting with N as indicated by Expression (17) stated above.

By adjusting the parameters K, L, M and N with due consideration for the cut-off frequency $f_c$ as described so far, $P_2$ and Z can be set as to secure a phase margin for the whole loop, making it possible to design a stable enough control circuit.

Now will be described another preferred embodiment of the present invention.

This embodiment has a control circuit digitized by subjecting the output signal from the object of control to A/D conversion and a digital control signal to D/A conversion.

Figure 11:
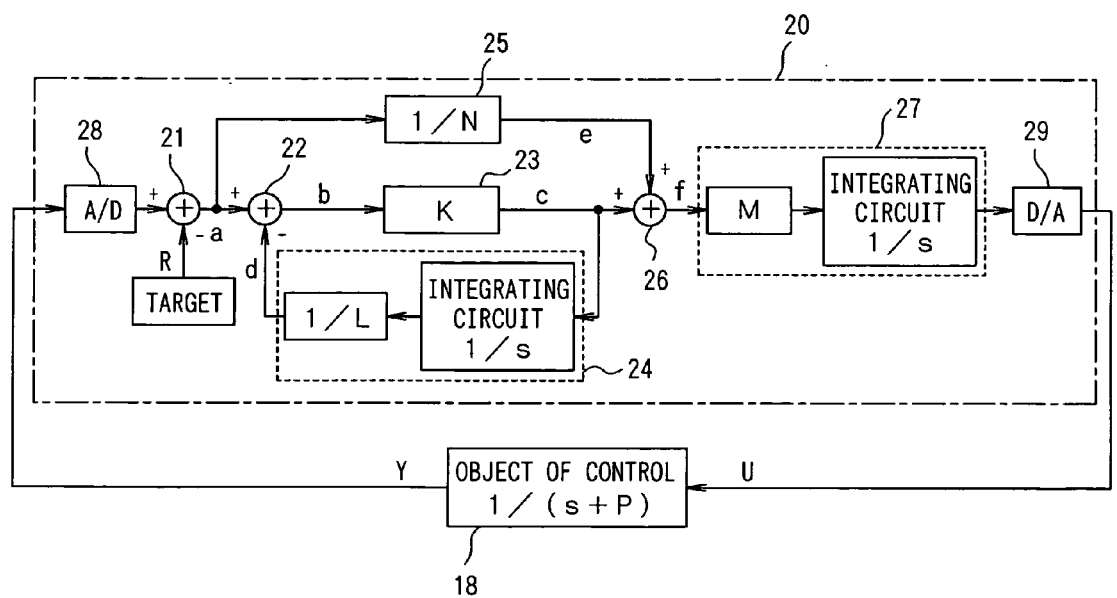
FIG. 11 shows a control circuit in another preferred embodiment of the invention.

As shown in FIG. 11, the control circuit 20 here has the same configuration as what is shown in FIG. 8 except that the output signal Y from the object of control 18 is subjected to A/D conversion by an A/D converter 28, the difference between the converted signal and the target R is figured out to generate the signal a, the signals a through f are supplied as digital signals, a signal resulting from multiplying the signal f by M and then integrated is subjected to D/A conversion by an D/A converter 29, and this converted signal is supplied as the control signal U. Therefore, parts having counterparts in FIG. 8 are denoted by respectively the same reference signs, and their detailed description is dispensed with.

By subjecting the output signal from the object of control to A/D conversion and the digital control signal to D/A conversion as described above, the control circuit can be digitized to eliminate its fluctuations and to readily realize large scale integration.

Figure 12:
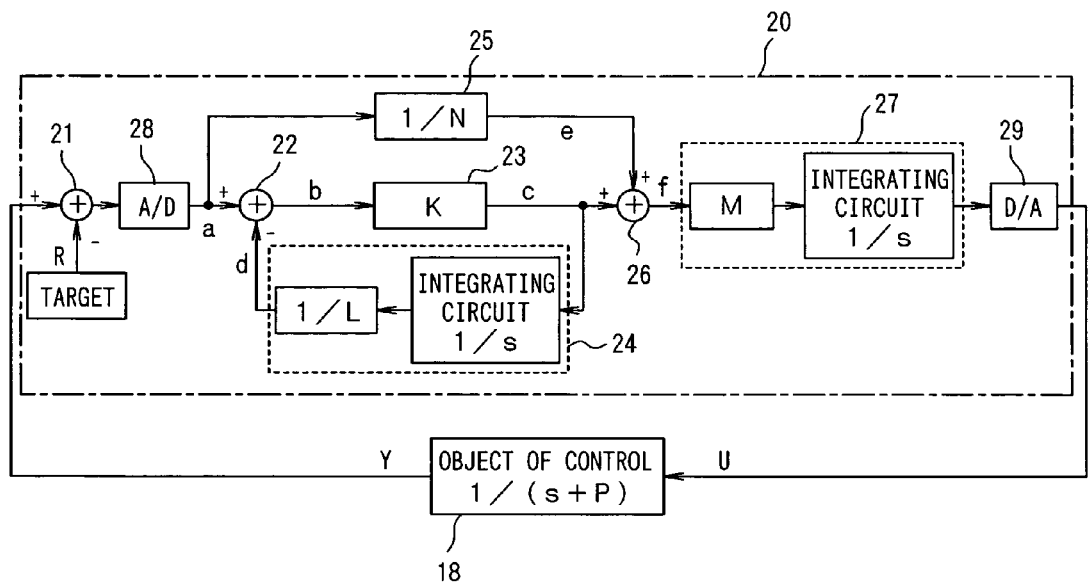
FIG. 12 shows a control circuit in another preferred embodiment of the invention.

Although the foregoing description of the embodiment supposes that the output signal from the object of control is subjected to A/D conversion and the difference between the converted signal and the target is figured out to generate the signal a, the procedure is not limited to this. As shown in FIG. 12, it is also conceivable to subject the difference between the output signal Y from the object of control 18 and the target R to A/D conversion to generate the signal a.

Figure 13:
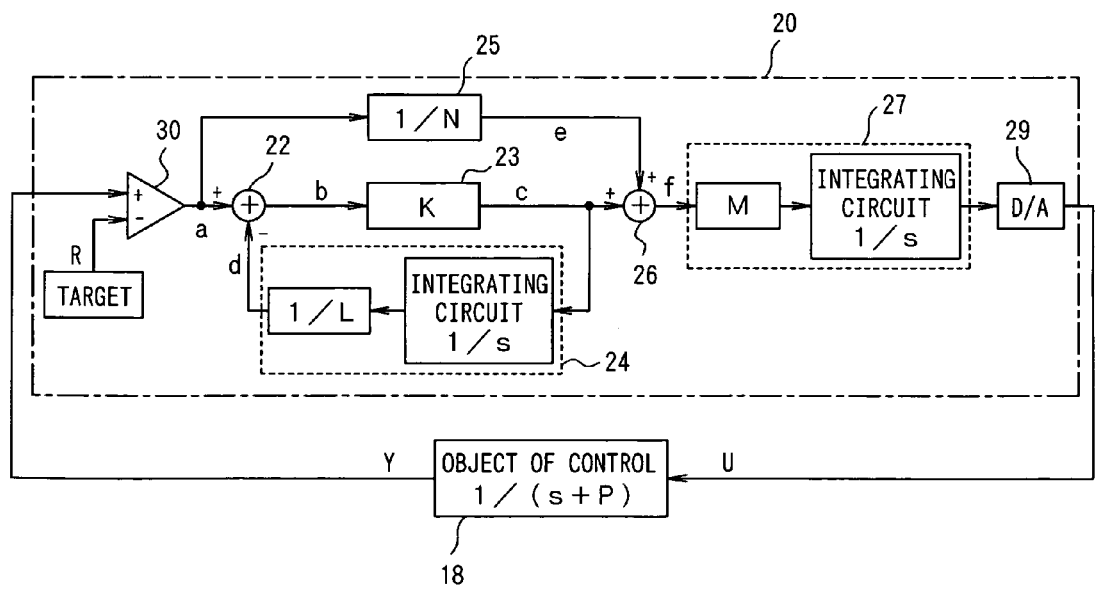
FIG. 13 shows a control circuit in another preferred embodiment of the invention.

Further, though the foregoing description of the embodiment supposes that the output signal from the object of control is subjected to A/D conversion and the difference between the converted signal and the target is figured out to generate the signal a, the procedure is not limited to this. As shown in FIG. 13, it is also conceivable to connect the output signal Y from the object of control 18 the positive pole input of a comparator and the target R to the negative pole input of the same to generate the signal a. In this case, too, the signal a is supplied as a digital signal, and the digitization of the control circuit serves to eliminate fluctuations of the control circuit and to readily realize large scale integration.

Next will be described still another embodiment of the invention.

This embodiment uses an add accumulator with carry in place of the 1/N multiplier shown in FIG. 11.

If the cut-off frequency $f_c$ of the object of control may fluctuate between 0.01 Hz and 0.1 Hz, $P_2$ and Z of the control circuit have to be sufficiently far from these frequencies. In FIG. 10, the relationship between $P_2$ and $f_o$ and that between $f_o$ and $f_c$ can be represented by the following Expressions (18) and (19):

$$P_2 > 10 f_o \tag{18}$$

$$f_o > 10 f_c \tag{19}$$

As stated above, $P_2$ should be a sufficiently higher frequency than $f_o$, and Z should be a sufficiently lower frequency than $f_c$. Thus, $P_2$ and Z are represented by the following Expressions (20) and (21), respectively.

$$P_2 > 100 \times 0.1 \tag{20}$$

$$Z < 0.01/10 \tag{21}$$

Therefore, the relationship between $P_2$ and Z is represented by the following Expression (22), which means that $P_2$ should be at least 10,000 times greater than Z:

$$P_2 > 10000 Z \tag{22}$$

From Expressions (17) and (22) stated above, NK can be approximated by the following Expression (23):

$$NK > 10000 \tag{23}$$

K=1 being supposed, N>10000 holds. This can be expressed in a power of 2 for the sake of simplifying the digital circuitry as $N > 2^{14}$, which means that the signal e shown in FIG. 11 is below the signal a by 14 bit positions. Since the calculation should be extended by 14 bit positions for this reason, additional adders and signal lines will be required to match the extra 14 bits, resulting in an expanded circuit scale. Though it is possible to reduce N by enlarging K, the digit positions of the signal c would increase correspondingly to the enlarged K, and accordingly the result would be all the same.

Figure 14:
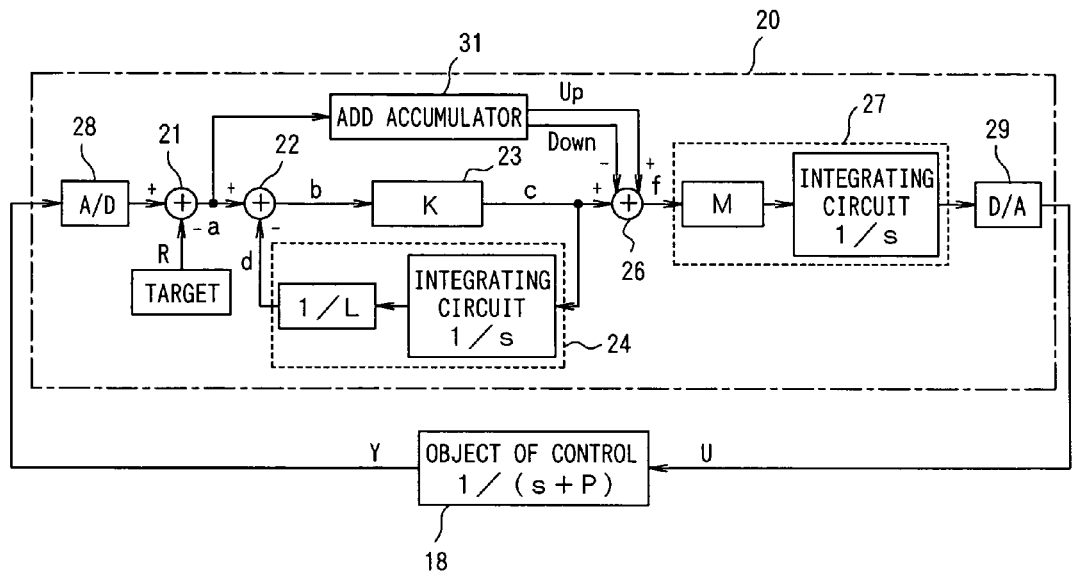
FIG. 14 shows a control circuit in another preferred embodiment of the invention.

In view of this problem, an add accumulator with carry is used as shown in FIG. 14 in place of the 1/N multiplier circuit shown in FIG. 11. As the control circuit 20 of this embodiment has the same configuration as what is shown in FIG. 11 except that the add accumulator with carry 31 is used in place of the 1/N multiplier circuit 25, parts having counterparts in FIG. 11 will be denoted by respectively the same reference signs, and their detailed description will be dispensed with.

The add accumulator with carry 31 is composed by connecting the signal a to a first input of an adder (not shown), and connecting the output of this adder to a second input of the adder. Thus, it is configured that, as the signal a is successively added, when the cumulative sum is greater than N−1, N−1 is subtracted from the cumulative sum and an Up carry is outputted or, when it is smaller than −N, N is added to the cumulative sum and a Down carry is outputted. An Up carry as +1 and a Down carry as −1 are added to the signal c.

Thus, unlike the 1/N multiplier circuit which adds 1/N times to the signal c each time as shown in FIG. 11, this add accumulator with carry adds +1 or −1 when the additional signal has become sufficiently large. Thus, it collectively adds 1/N-multiplied signals, and the total sum of the signals e is no different.

Here, the add accumulator with carry 31 may as well subtract N from the cumulative sum and output an Up carry when the cumulative sum is greater than N, and add N to the cumulative sum and output a Down carry when the cumulative sum is smaller than −N.

A circuit that outputs an Up carry when N is surpassed has a better balance between Up carry and Down carry, but it involves one more bit in the number of bits of the adder than a circuit that outputs an Up carry when N−1 is surpassed, resulting in an expanded circuit scale. If N is sufficiently greater than 1, this difference can be ignored in calculation, a circuit that outputs an Up carry when N−1 is surpassed is applied here. This makes the accumulator similar in configuration to the conventional add accumulator with carry in the digital circuitry, which therefore can be reduced in size.

The use of the add accumulator with carry in place of the 1/N multiplier circuit as described above makes it possible to realize the needed function without have to increase the number of digit positions in the calculation by the 1/N multiplier circuit, thereby to reduce the size of the control circuit, which facilitates large scale integration.

Moreover, as $P_2$ and Z of the control circuit can be set with the possibility of the cut-off frequency $f_c$ due to individual differences and type differences of the object of control taken into consideration, parameters need not be redesigned even when the element type of the object of control is to be changed, resulting in a reduction in man-hours spent on development.

Furthermore by differentiating the values of the parameters K, L, M and N of the control circuit between start-up and stabilized operation, the convergence time taken until stabilization can be shortened. Where the time constant of the control circuit is low, a longer time is taken until a constant state is attained, and shortening this period requires an expansion of the bandwidth of the whole loop. The bandwidth has to be expand toward the high frequency side. Moreover, since expansion toward the high frequency side would reduce the phase margin and destabilize the loop, the bandwidth should be expanded only during a specific period of time after start-up, followed by a return to the normal bandwidth. This, however, can be achieved by merely altering the values of the parameters K, L, M and N of the control circuit.

A direct switch-over from the setting for start-up to that for stabilized operation for each parameter would require a certain period of time for the stabilization of the internal state after the switch-over, but this can be avoided by gradually altering the value of each parameter during the period from start-up until stabilization. The resultant variations within the control circuit and of the loop bandwidth to bring them to convergence can also make the convergence to be achieved sooner than usual.

As hitherto described, where the reaction characteristic of a laser module, which is the object of control, can be approximated to a low pass filter, and the cut-off frequency $f_c$ may vary from one individual element to another and with the type of element, control is accomplished with a control circuit which is stable even with such individual differences and type differences being taken into consideration, stable temperature control can be achieved without spending many man-hours on development.

What is claimed is:

1. A control device, comprising:
an object to be controlled, the object to be controlled having a cut-off frequency and comprising:
a semiconductor laser, and
an optical filter which receives light from the semiconductor laser and whose transmissivity varies with the wavelength of the light; and
a first control component controlling the optical wavelength of the semiconductor laser to a prescribed wavelength by driving a temperature control unit to control the temperature of the semiconductor laser, the first control component having a transfer function and comprising:
a first input receiving a first photoelectric conversion signal representing the intensity of light transmitted by the optical filter;
a second input receiving a target signal corresponding to the prescribed wavelength; and
an output providing a control signal for driving the temperature control unit;
wherein:
the transfer function has a low pass characteristic, a plurality of poles, and a zero;
the frequency of the pole having the highest frequency is higher than the cut-off frequency; and
the frequency of the zero is lower than the cut-off frequency;
wherein the semiconductor laser, the optical filter, and the first control component are configured to form a feedback loop.

2. The control device according to claim 1, wherein the first control component comprises:
comparing means for comparing said first photoelectric conversion signal and said target signal; and
arithmetic operation means which is set to compute the output of the comparing means so as to cause the frequency of the pole having the highest frequency to be higher than the cut-off frequency and the frequency of the zero to be lower than the cut-off frequency.

3. The control device according to claim 2, wherein said arithmetic operation means comprises:
proportional means which multiplies the difference between the output of said comparing means and a feedback signal by an integer;

first integrating means which, after integrating the output of the proportional means, feeds back the integrated output as said feedback signal;

additional signal generating means which multiplies the output of said comparing means by the reciprocal of an integer and adding the result to the output of said proportional means; and second integrating means which integrates the output of the additional signal generating means and supplies the integrated output as said control signal.

4. The control device according to claim 2, wherein said arithmetic operation means comprises:

proportional means which multiplies the difference between the output of the comparing means and a feedback signal by K (K is an integer not smaller than 1);

first integrating means which, after integrating the output of the proportional means, multiplies the integrated output by 1/L (L is an integer not smaller than 1) and feeds the multiplied output as said feedback signal;

additional signal generating means which multiplies the output of said comparing means by 1/N (N is an integer not smaller than 1) and adds the multiplied output to the output of said proportional means; and second integrating means which, after multiplying by M the sum of the output of the additional signal generating means and the output of said proportional means, integrates the multiplied sum and supplies the integrated multiple as said control signal, wherein the value of said K and that of said L are set such that the frequency of the pole having the highest frequency is higher than the cut-off frequency, the value of said N is set such that the frequency of the zero is lower than the cut-off frequency, and the value of said M is set such that the gain from a low frequency range to the cut-off frequency is at least 1.

5. The control device according to claim 4, wherein said additional signal generating means, when the cumulative sum of the output of said comparing means is greater than N−1 (N is an integer not smaller than 1), subtracts N−1 from the cumulative sum and makes +1 the signal to be added to the output of said proportional means or, when the cumulative sum is smaller than −N, adds N to the cumulative sum and makes −1 the signal to be added to the output of said proportional means.

6. The control device according to claim 4, wherein said additional signal generating means, when the cumulative sum of the output of said comparing means is greater than N (N is an integer not smaller than 1), subtracts N from the cumulative sum and makes +1 the signal to be added to the output of said proportional means or, when the cumulative sum is smaller than −N, adds N to the cumulative sum and makes −1 the signal to be added to the output of said proportional means.

7. The control device according to claim 4, wherein said arithmetic operation means is configured such that the respective values of said K, said M, said N and said L are set differently between the time of start-up and a period of stabilized operation.

8. The control device according to any of claims 3 through 7, further comprising D/A conversion means which subjects the output of said second integrating means to D/A conversion, wherein said comparing means is configured so as to subject said first photoelectric conversion signal to A/D conversion and to detect the difference between the converted signal and said target signal.

9. The control device according to any of claims 3 through 7, further comprising D/A conversion means which subjects the output of said second integrating means to D/A conversion, wherein said comparing means is configured so as to detect the difference between said first photoelectric conversion signal and said target signal and to subject this difference to A/D conversion.

10. The control device according to any of claims 3 through 7, further comprising D/A conversion means which subjects the output of said second integrating means to D/A conversion, wherein said comparing means is configured so as to connect said first photoelectric conversion signal to the positive pole input of a comparator and to connect said target signal to the negative pole input of the comparator.

11. The control device according to claim 1, further comprising a second control component which controls an optical output intensity control current to be supplied to said semiconductor laser so as to equalize a second photoelectric conversion signal to an optical output intensity control target signal, said second photoelectric conversion signal being an electric signal converted from the light beams resulting from the branching of the light supplied from the semiconductor laser, said optical output intensity control target signal controlling the optical output intensity of said semiconductor laser to a prescribed intensity, wherein said second control component comprises:

first generating means for generating a wavelength control target signal for controlling the optical wavelength of said semiconductor laser to the prescribed wavelength;

second generating means for generating a conversion coefficient corresponding to a transmissivity for the desired wavelength of said optical filter;

subtracting means for subtracting said optical output intensity control target signal from said second photoelectric conversion signal to figure out the quantity of variation of the optical output intensity;

multiplying means for multiplying said conversion coefficient by the quantity of variation of said optical output intensity to figure out a correction value for said wavelength control target signal matching the quantity of variation of the optical output intensity; and adding means for adding said wavelength control target signal to the correction value for correcting said wavelength control target signal with the correction value, wherein the target signal corrected by said adding means is entered into the first control component.

12. The control device according to claim 11, wherein said first photoelectric conversion signal is a signal resulting from the passage of the other of said branched lights through said optical filter to be converted into an electric signal, and said conversion coefficient is a value obtained by dividing said first photoelectric conversion signal by said second photoelectric conversion signal in a condition where said semiconductor laser has the desired optical output intensity and wavelength.

13. An integrated circuit for controlling the optical wavelength of a semiconductor laser in a feedback loop to a prescribed wavelength by driving a temperature control unit to control the temperature of the semiconductor laser, the integrated circuit having a transfer function and comprising:

a first input receiving a first photoelectric conversion signal representing the intensity of light transmitted by an optical filter;

a second input receiving a target signal corresponding to the prescribed wavelength; and an output providing a control signal for driving the temperature control unit;

wherein:
the transfer function has a low pass characteristic, a plurality of poles, and a zero;
the frequency of the pole having the highest frequency is higher than the cut-off frequency of an object to be controlled; and
the frequency of the zero is lower than the cut-off frequency.

14. The integrated circuit according to claim 13, comprising:
comparing means for comparing said first photoelectric conversion signal and said target signal; and
arithmetic operation means which is set to compute the output of the comparing means so as to cause the frequency of the pole having the highest frequency to be higher than the cut-off frequency and the frequency of the zero to be lower than the cut-off frequency.

15. The integrated circuit according to claim 14, wherein said arithmetic operation means comprises:
proportional means which multiplies the difference between the output of said comparing means and a feedback signal by an integer;
first integrating means which, after integrating the output of the proportional means, feeds back the integrated output as said feedback signal;
additional signal generating means which multiplies the output of said comparing means by the reciprocal of an integer and adding the result to the output of said proportional means; and
second integrating means which integrates the output of the additional signal generating means and supplies the integrated output as said control signal.

16. The integrated circuit according to claim 14, wherein said arithmetic operation means comprises:
proportional means which multiplies the difference between the output of the comparing means and a feedback signal by K (K is an integer not smaller than 1);
first integrating means which, after integrating the output of the proportional means, multiplies the integrated output by 1/L (L is an integer not smaller than 1) and feeds the multiplied output as said feedback signal;
additional signal generating means which multiplies the output of said comparing means by 1/N (N is an integer not smaller than 1) and adds the multiplied output to the output of said proportional means; and
second integrating means which, after multiplying by M the sum of the output of the additional signal generating means and the output of said proportional means, integrates the multiplied sum and supplies the integrated multiple as said control signal,
wherein
the value of said K and that of said L are set such that the frequency of the pole having the highest frequency is higher than the cut-off frequency, the value of said N is set such that the frequency of the zero is lower than the cut-off frequency, and the value of said N is set such that the gain from a low frequency range to the cut-off frequency is at least 1.

17. The integrated circuit according to claim 16, wherein said additional signal generating means, when the cumulative sum of the output of said comparing means is greater than N−1 (N is an integer not smaller than 1), subtracts N−1 from the cumulative sum and makes +1 the signal to be added to the output of said proportional means or, when the cumulative sum is smaller than −N, adds N to the cumulative sum and makes −1 the signal to be added to the output of said proportional means.

18. The integrated circuit according to claim 16, wherein said additional signal generating means, when the cumulative sum of the output of said comparing means is greater than N (N is an integer not smaller than 1), subtracts N from the cumulative sum and makes +1 the signal to be added to the output of said proportional means or, when the cumulative sum is smaller than −N, adds N to the cumulative sum and makes −1 the signal to be added to the output of said proportional means.

19. The integrated circuit according to claim 16, wherein said arithmetic operation means is configured such that the respective values of said K, said M, said N and said L are set differently between the time of start-up and a period of stabilized operation.

20. The integrated circuit according to any of claims 15 through 19, further comprising D/A conversion means which subjects the output of said second integrating means to D/A conversion, wherein said comparing means is configured so as to subject said first photoelectric conversion signal to A/D conversion and to detect the difference between the converted signal and said target signal.

21. The integrated circuit according to any of claims 15 through 19, further comprising D/A conversion means which subjects the output of said second integrating means to D/A conversion, wherein said comparing means is configured so as to detect the difference between said first photoelectric conversion signal and said target signal and to subject this difference to A/D conversion.

22. The integrated circuit according to any of claims 15 through 19, further comprising D/A conversion means which subjects the output of said second integrating means to D/A conversion, wherein said comparing means is configured so as to connect said first photoelectric conversion signal to the positive pole input of a comparator and to connect said target signal to the negative pole input of the comparator.

23. The integrated circuit according to claim 13, further comprising a control component which controls an optical output intensity control current to be supplied to said semiconductor laser so as to equalize a second photoelectric conversion signal to an optical output intensity control target signal, said second photoelectric conversion signal being an electric signal converted from the light beams resulting from the branching of the light supplied from the semiconductor laser, said optical output intensity control target signal controlling the optical output intensity of said semiconductor laser to a prescribed intensity, wherein the control component comprises:
first generating means for generating a wavelength control target signal for controlling the optical wavelength of said semiconductor laser to the prescribed wavelength;
second generating means for generating a conversion coefficient corresponding to a transmissivity for the desired wavelength of said optical filter;
subtracting means for subtracting said optical output intensity control target signal from said second photoelectric conversion signal to figure out the quantity of variation of the optical output intensity;
multiplying means for multiplying said conversion coefficient by the quantity of variation of said optical output intensity to figure out a correction value for said wavelength control target signal matching the quantity of variation of the optical output intensity; and adding means for adding said wavelength control target signal to the correction value for correcting said wavelength control target signal with the correction value.

24. The integrated circuit according to claim 23, wherein said first photoelectric conversion signal is a signal resulting from the passage of the other of said branched tights through said optical filter to be converted into an electric signal, and said conversion coefficient is a value obtained by dividing said first photoelectric conversion signal by said second photoelectric conversion signal in a condition where said semiconductor laser has the desired optical output intensity and wavelength.

* * * * *

UNITED STATES PATENT AND TRADEMARK OFFICE
CERTIFICATE OF CORRECTION

PATENT NO. : 7,372,881 B2
APPLICATION NO. : 10/960021
DATED : May 13, 2008
INVENTOR(S) : Izumi Kawata et al.

It is certified that error appears in the above-identified patent and that said Letters Patent is hereby corrected as shown below:

On the title page, item (57), line 9, "photo electric" should read --photoelectric--.

In claim 24, column 23, line 6, "tights" should read --lights--.

Signed and Sealed this

Twelfth Day of August, 2008

JON W. DUDAS
*Director of the United States Patent and Trademark Office*